United States Patent [19]

Ohtsuki

[11] Patent Number: 5,237,536
[45] Date of Patent: Aug. 17, 1993

[54] SEMICONDUCTOR MEMORY DEVICE HAVING SPLIT OPERATION AND CAPABLE OF REDUCING POWER SUPPLY NOISE

[75] Inventor: Yoshio Ohtsuki, Tokyo, Japan

[73] Assignee: Oki Electric Industry Co., Ltd., Tokyo, Japan

[21] Appl. No.: 647,589

[22] Filed: Jan. 29, 1991

[30] Foreign Application Priority Data

Jan. 29, 1990 [JP] Japan ................................. 2-18254

[51] Int. Cl.[5] .......................... G11C 7/00; G11C 11/40
[52] U.S. Cl. ........................... 365/230.06; 365/230.01; 365/230.03; 365/230.08
[58] Field of Search ...................... 365/230.06, 230.01, 365/230.08, 230.02

[56] References Cited

U.S. PATENT DOCUMENTS

| 4,542,486 | 9/1985 | Anami | 365/230.06 |
| 4,636,982 | 1/1987 | Takemae et al. | 365/230.06 |
| 4,768,166 | 8/1988 | Anami | 365/230.06 |

Primary Examiner—Eugene R. LaRoche
Assistant Examiner—Viet Q. Nguyen
Attorney, Agent, or Firm—Edward D. Manzo; David K. Lucente

[57] ABSTRACT

In a semiconductor memory device comprising a plurality of groups of memory cell blocks, a plurality of groups of predecoder input signal lines respectively connected to predecoders in the memory cell block groups, and a predecoder input signal generator. The predecoder input signal generator sets the predecoder input signal lines of the selected group to either the high level or the low level in accordance with the external address information. A clamping circuit is provided to clamp substantially half the predecoder input signal lines of the unselected group to the high level, and the remaining half to the low level. Because one half of the predecoder input signal lines of the unselected group is clamped to the high level and the remaining half of the unselected group is clamped to the low level, their line loads serve as decoupling capacitors both at the charging and discharging of the predecoder input signal lines of the selected group, so that the power supply noise is reduced in both occasions.

8 Claims, 5 Drawing Sheets

SEMICONDUCTOR MEMORY DEVICE HAVING SPLIT OPERATION AND CAPABLE OF REDUCING POWER SUPPLY NOISE

FIELD OF THE INVENTION

The present invention relates to a semiconductor memory device, such as a dynamic random-access memory or the like which is highly-integrated and is capable of split operation, and which is featured by the reduction in the power supply noise generated when external input address bits are changed.

BACKGROUND OF THE INVENTION

An example of prior art semiconductor memory device of this type is shown in FIG. 2. This prior art configuration will now be described by making reference to the figure.

FIG. 2 is a block diagram showing the pertinent portion of a typical prior art semiconductor memory device. It will be noted that, while an actual device has a plurality of address bits, FIG. 2 shows circuits for only two address bits to facilitate the explanation.

As shown, this semiconductor memory device is of a split configuration, i.e., it comprises a plurality of, e.g., two, groups of memory cell blocks, namely a first memory cell block group 10-1 and a second memory cell block group 10-2. The first memory cell block group 10-1 is connected on the address input side to a first group of predecoder input signal lines 12-1 consisting of a plurality of predecoder input signal lines AB1L and AB2L. The second memory cell block group 10-2 is connected on the address input side to a second group of predecoder input signal lines 12-2 consisting of a plurality of predecoder input signal lines AB1R and AB2R. The first and second predecoder input signal groups 12-1 and 12-2 are driven by predecoder input signal generator 20, which is connected to a plurality of address buffers 30-1 and 30-2 via a plurality of address buses AB1 and AB2.

Each of the first and second memory cell block groups 10-1 and 10-2 are comprised of a plurality of memory cell blocks 11, each of which consists of a memory cell array 11a having a decoder, sense amplifiers, etc., and a predecoder 11b for predecoding predecoder input signals AB1L, AB2L, or AB1R, AB2R.

Predecoder input signal generator 20 selectively activates either the first predecoder input signal group 12-1 or the second predecoder input signal group 12-2 in accordance with group select signals $\phi_L$, $\phi_R$, and is comprised of a plurality of gate circuits 21, 22 that receive the group select signals $\phi_L$, $\phi_R$ and address bits AB1, AB2. The outputs of the gate circuits 21, 22 are connected to predecoder input signal groups 12-1, 12-2. Gate circuit 21 consists of a two-input NAND gate 21a, and an inverter 21b. In the same way, gate circuit 22 consists of a two-input NAND gate 22a, and an inverter 22b.

A plurality of address buffers 30-1, 30-2 receive a plurality of external input address bits A1, A2 and pass those signals to the predecoder input signal generator 20 via address buses AB1, AB2.

Notations C1L, C2L, C1R, C2R in FIG. 2 represent the line loads of predecoder input signal lines for transmitting predecoder input signal AB1L, AB2L, AB1R, AB2R, respectively.

FIG. 3 shows a circuit diagram of the pertinent portion of the line load of FIG. 2.

In the figure, only the line loads C1L, C1R for predecoder input signal lines AB1L, AB1R, and inverters 21b, 22b are shown. Inverter 21b is a complementary metal-oxide-semiconductor (hereafter, CMOS) device comprising a p-channel metal-oxide-semiconductor (hereafter, PMOS) transistor 21b-1 and an n-channel metal-oxide-semiconductor (hereafter NMOS) transistor 21b-2. Inverter 22b likewise consists of a CMOS device comprising PMOS transistor 22b-1 and NMOS transistor 22b-2.

FIG. 4 is a timing chart for the device shown in FIG. 2. Referring now to this figure, the operation of the devices depicted in FIG. 2 and FIG. 3 will now be described.

The following description is directed to the operation of the present device responsive to the external input address bits A1, A2 that takes place when the semiconductor memory device has been activated by an external activation signal.

Assume, for example, that either group select signal $\phi_L$ or $\phi_R$ for selecting either the first memory cell block group 10-1 or the second memory cell block group 10-2 is selectively changed from the low level to the high level.

When group select signal $\phi_L$ is at the low level, the first memory cell block group 10-1 is set in the unselected state by an unselect/select means (not shown in the figure). That is, the first memory cell block group 10-1 is in a state in which reading data in and writing data from it is inhibited. At the same time, the first group 12-1 of predecoder input signal lines AB1L, AB2L are clamped at the low level by gate circuit 21, regardless of the data on external input address bits A1, A2. On the other hand, since the group select signal $\phi_R$ is at the high level, the second memory cell block group 10-2 is set in the select state by an unselect/select means (not shown in the figure), and at the same time, the second group 12-2 of predecoder input signal lines AB1R, AB2R asserts high/low level binary logic via gate circuit 22 based on the information input over external input address bits A1, A2.

Next, the operation that takes place when external input address bits A1 and A2 change to the high level and the low level, respectively will be described.

First, when external input address bit A1 is at the low level and external input address bit A2 is at the high level, that information is fetched by address buffers 30-1, 30-2, and appears on address buses AB1, AB2, after a short propagation time delay. Since the address bits on address buses AB1, AB2 are propagated via their respective gate circuits 22, predecoder signal AB1R goes low and predecoder signal AB2R goes high after a short propagation time delay. Consequently, line load C1R on predecoder input signal line AB1R is discharged to the low level through NMOS transistor 22b-2 shown in FIG. 3, and line load C2R on the side of predecoder input signal line AB2R is charged to the high level from power supply voltage Vcc through PMOS transistor 22b-1.

Next, if external input address bit A1 goes from the low level to the high level, and external input address bit A2 goes from the high level to the low level, predecoder input signal AB1R changes from the low to high level and AB2R changes from the high level to low level. As a result, line load C1R is charged via PMOS transistor 22b-1 to the high level from power supply Vcc, and line load C2R is discharged via NMOS transistor 22b-2 to the low level on the power supply Vss (=0) side.

As described above, the selected group of predecoder input signal lines 12-2 assume binary logic based on the external input address information A1, A2. This binary logic is predecoded by predecoder 11b, and is then decoded by the decoder in memory cell array 11a and memory cell locations corresponding to external input address bits A1, A2 are selected. Then, accessing with data can be made at these memory cell locations by means of read/write circuitry, that is not shown in the figure.

However, this conventional semiconductor memory device is associated with the following problem.

In the prior art semiconductor memory device, when external input address bits A1, A2 change all at once either from the high to the low level or from the low to the high level, the Vcc noise (fluctuation) due to the voltage change of the selected second predecoder input signal group is large.

More specifically, when external input address bits A1, A2 change all at once from the high level to the low level (Case 1), the charges on line loads C1R, C2R are discharged all at once to power supply Vss through inverter 22b. When this occurs, since the unselected first group of predecoder input signal lines 12-1 are clamped at the low level, line loads C1L, C2L act as decoupling capacitors for power supply Vss (for restraining the voltage fluctuation by the action of the capacitor), and this serves to alleviate the Vss noise caused by the afore-mentioned discharging. On the other hand, when external input address bits A1, A2 all change from the low level to the high level (Case 2), since line loads C1R, C2R are all charged at once from power supply Vcc through inverter 22b, Vcc noise is generated by this charging current. When this occurs, the unselected first group of predecoder input signal lines 12-1 are clamped at the low level, the same as in Case 1, so line loads C1L, C2L do not act as decoupling capacitors for supply voltage Vcc. As a consequence, the Vcc noise is large.

Along with increased capacity, the integration density of semiconductor memory devices is also continuing to increase. The trend therefore, due to such factors as longer line lengths, is toward increased line loads on predecoder input signal lines. What is more, since Vcc, Vss are also fed to read and write circuits (not shown in the figure) in addition to the line loads, increased noise leads to other problems, such as declining stability of other circuits and slower response speed.

SUMMARY OF THE INVENTION

An object of the present invention is to provide a semiconductor memory device that effectively overcomes the problem associated with the prior art technology that was described above; viz, increasing power supply noise that accompanies greater levels of chip integration density.

In order to overcome the above-mentioned drawback of conventional technologies, a semiconductor memory device according to the invention comprises:

a plurality of groups of memory cell blocks capable of split operation, each of said groups of memory cell blocks being provided with a plurality of memory cell blocks having predecoders receiving predecoder input signals;

a predecoder input signal generator responsive to a group select signal which causes said groups of memory cell blocks to perform split operation, for selectively activating the groups of predecoder input signal lines, and setting the predecoder input signal lines for the selected group of memory cell block to either the high level or the low level depending the external address information; and a clamping means responsive to said group select signal for clamping substantially half of the predecoder input signal lines for the group of memory cell blocks that are not selected by said group select signal, to the high level, and the remaining half to the low level.

As a semiconductor memory device according to the present invention is configured as described above, on the basis of the group select signal, the predecoder input signal generator selects the group of predecoder input signal lines for the group of memory cell blocks have been selected by the group select signal, activates it, and sets the group of input signal lines for the selected group at either the high level or the low level in accordance with the external address information. Then, the predecoders in the selected memory cell block group predecode the high-low binary logic of the input predecoder input signals, for selection of the memory cells. Meanwhile, the clamping means clamps approximately half of the predecoder input signal lines for the unselected group at the high level and the remaining half at the low level. Adopting this procedure, the line loads on the predecoder input signal lines for the unselected group act as decoupling capacitors that serve to suppress power supply fluctuations, or in other words, reduce power supply noise. This effectively solves the above-described problem of conventional semiconductor memory devices.

DETAILED DESCRIPTION OF THE PREFERRED EMBODIMENTS

Figure 1:
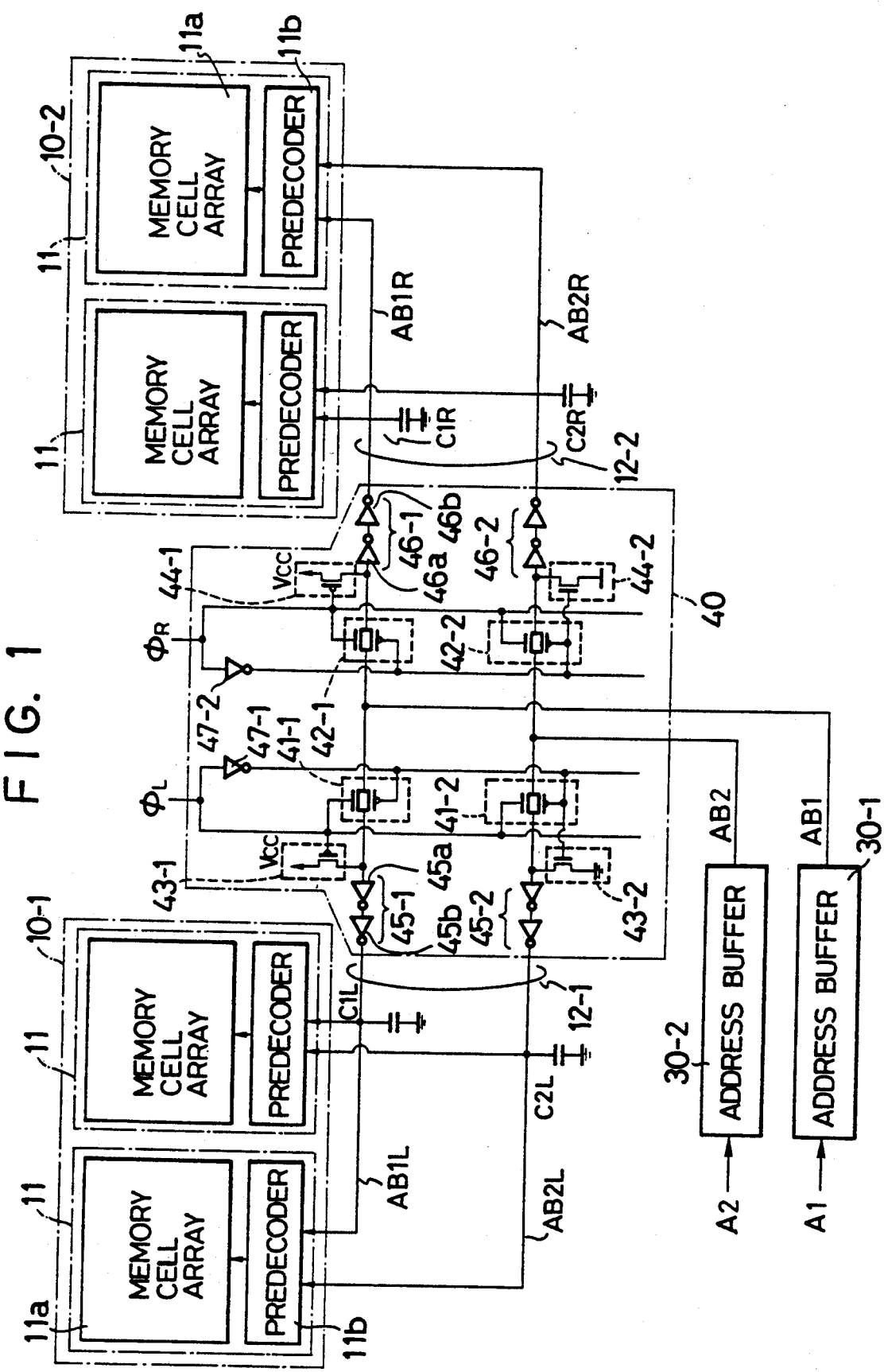
FIG. 1 is a block diagram showing the pertinent portion of a semiconductor memory device of an embodiment of the invention.

FIG. 1 is a schematic block diagram of the pertinent portion of a semiconductor memory device showing an embodiment of the invention. Common symbols have been retained for those elements that are essentially the same as in the prior art block diagram in FIG. 2. Here too, as with the diagram of the conventional device, only the circuitry for two address bits is shown in order to simplify the explanation.

Figure 2:
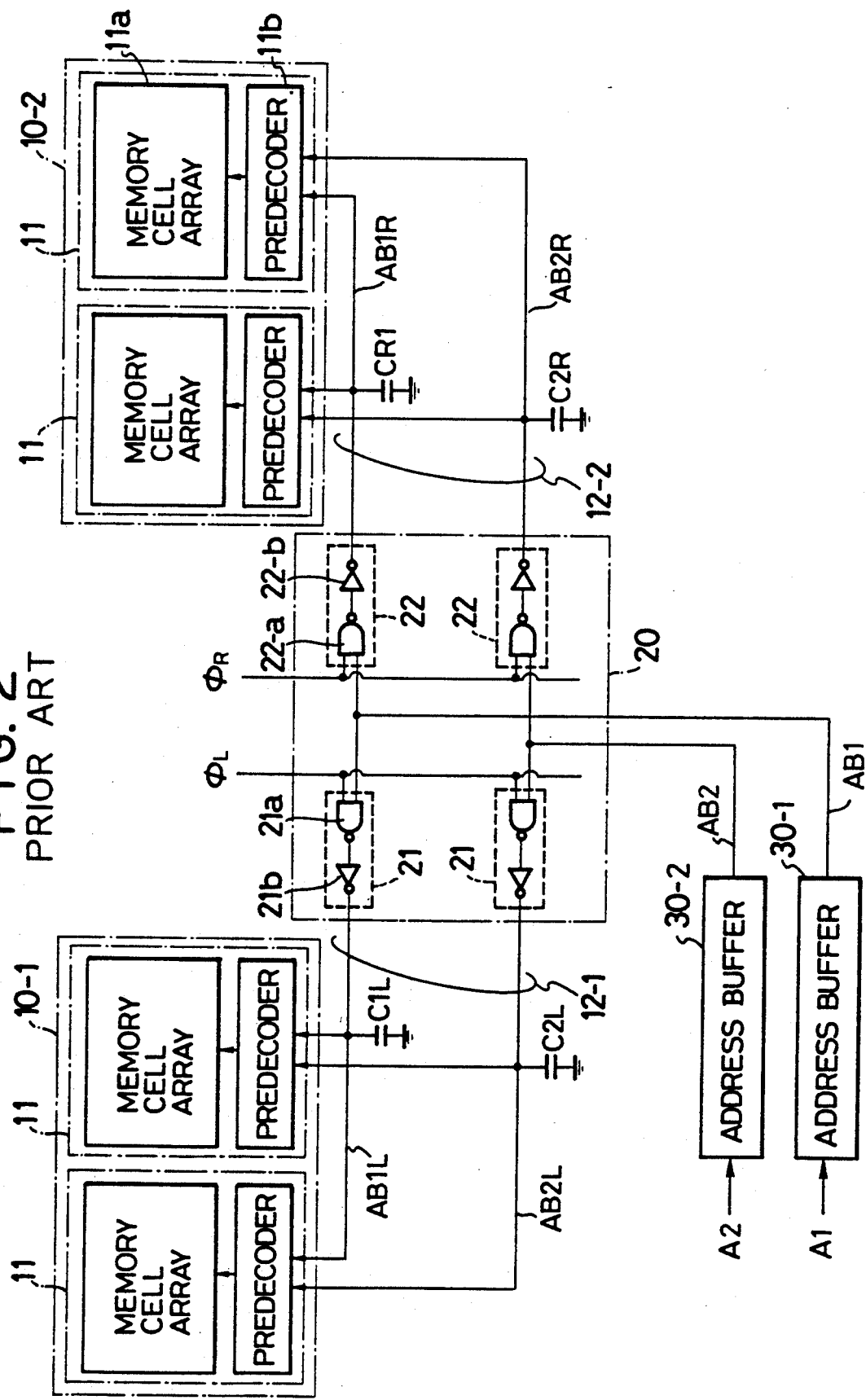
FIG. 2 is a block diagram showing the pertinent portion of a semiconductor memory device in the prior art.
Figure 3:
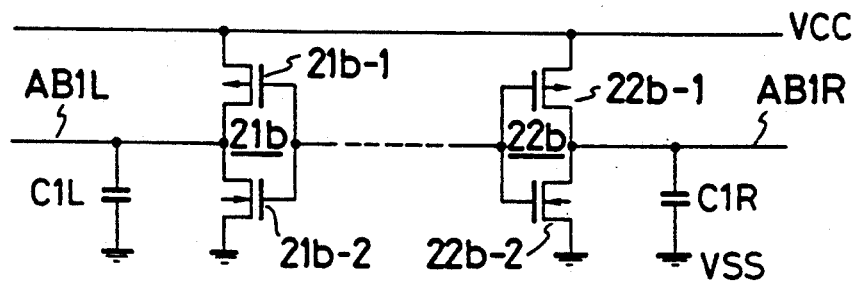
FIG. 3 is a circuit diagram of the pertinent portion of the device of FIG. 2.
Figure 4:
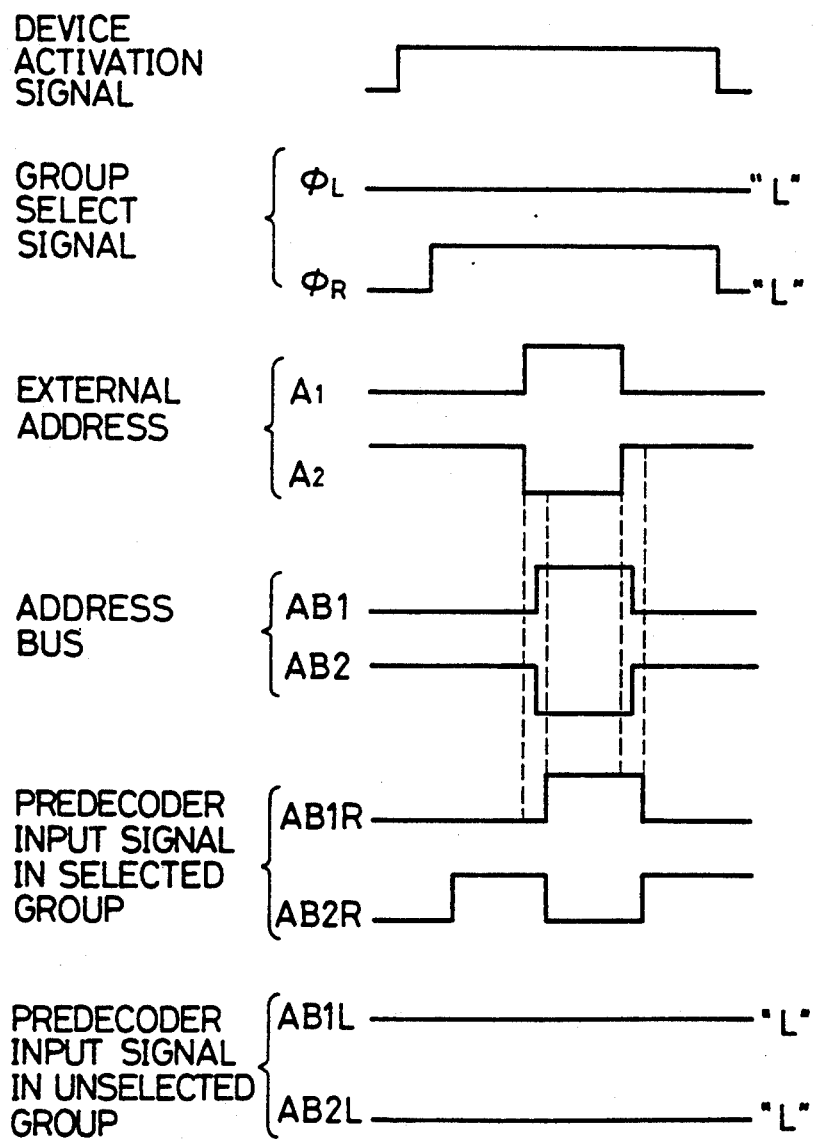
FIG. 4 is a timing chart showing the operation of the device of FIG. 2.

The essential difference between this semiconductor memory device and the conventional device shown in FIG. 2 is the clamping means provided in predecoder input signal generator 40 and related circuitry changes that are required. In all other respects, the configuration is identical to the prior art device in FIG. 2.

The predecoder input signal generator 40 comprises groups of transmission gates (41-1 and 41-2; and 42-1 and 42-2) provided for the respective predecoder input line groups (AB1L and AB2L; and AB1R and AB2R). Each group of transmission gates consists of transmission gates (e.g., 41-1 and 41-2) for the respective predecoder input signal lines (e.g., AB1L and AB2L) of the corresponding group (12-1) and connect the address buses AB1 and AB2 to the corresponding predecoder input signal lines (AB1L and AB2L). The transmission gates of each group are turned on and off in response to group select signals $\phi_L$ and $\phi_R$.

A first group of level-clamp transistors 43-1 and 43-2 are provided for the first group 12-1 of predecoder input signal lines AB1L and AB2L. A second group of level-clamp transistors 44-1 and 44-2 are provided for the second group 12-2 of predecoder input signal lines AB1R and AB2R. The level-clamp transistors serve as the clamping means. Repeaters 45-1, 45-2, 46-1 and 46-2 are provided for signal amplification and comprise two-stage inverters. Inverters 47-1 and 47-2 produce inverted signals which are inversions of the group select signals.

One electrodes, i.e., sources of transmission gates 41-1, 41-2, 42-1 and 42-2 are connected to corresponding address buses AB1 and AB2, while the other electrodes, i.e., drains of the transmission gates are connected to the first and second predecoder input signal line groups 12-1 and 12-2 via repeaters 45-1, 45-2, 46-1 and 46-2.

Level-clamp transistors 43-1, 43-2, 44-1 and 44-2 are connected via the repeaters 45-1, 45-2, 46-1 and 46-2 to the predecoder input signal lines AB1L, AB2L, AB1R and AB2R to either the high level (Vcc) or the low level (Vss). Specifically, first level-clamp transistor 43-1 of the first group of level-clamp transistors (43-1, 43-2) is connected via repeater 45-1 to predecoder input signal line AB1L, which constitute a first half of the first group 12-1 of predecoder input signal lines (AB1L, AB2L) to the high level when it is turned on due to the group select signal $\phi_L$ being low, i.e., when the corresponding predecoder input signal line group 12-1 is not selected. Second level-clamp transistor 43-2 of the first group of level-clamp transistors (43-1, 43-2) is connected via repeater 45-2 to predecoder input signal line AB2L, which constitute a second half of the first group 12-1 of predecoder input signal lines (AB1L, AB2L) to the low level when it is turned on due to the group select signal $\phi_L$ being low, i.e., when the corresponding predecoder input signal line group (AB1L, AB2L) is not selected. First level-clamp transistor 44-1 of the second group of level-clamp transistors (44-1, 44-2) is connected via repeater 46-1 to predecoder input signal line AB1R, which constitute a first half of the second group 12-2 of predecoder input signal lines (AB1R, AB2R) to the high level when it is turned on due to the group select signal $\phi_R$ being low, i.e., when the corresponding predecoder input signal line group (12-2) is not selected. Second level-clamp transistor 44-2 of the second group of level-clamp transistors (44-1, 44-2) is connected via repeater 46-2 to predecoder input signal line AB2R, which constitute a second half of the second group 12-2 of predecoder input signal lines (AB1R, AB2R) to the low level when it is turned on due to the group select signal $\phi_R$ being low, i.e., when the corresponding predecoder input signal line group 12-2 is not selected.

Repeater 45-1 is comprised of two cascade-connected inverters 45a and 45b, and repeater 46-1 is comprised of two cascade-connected inverters 46a and 46b.

Figure 5:
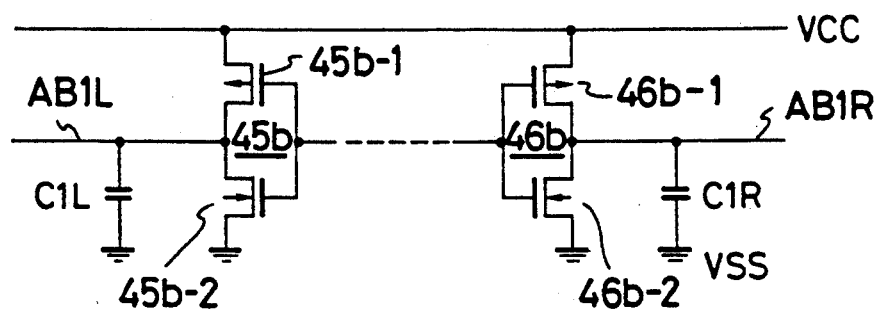
FIG. 5 is a circuit diagram of the pertinent portion of the device of FIG. 1.

FIG. 5 is a more detailed circuit diagram of the pertinent portion of FIG. 1, showing the vicinity of line load C1L on predecoder input signal line AB1L and line load C1R on predecoder input signal line AB1R.

In the figure, inverter 45b is a CMOS device comprised of PMOS transistor 45b-1 and NMOS transistor 45b-2, and inverter 46b is a CMOS device comprised of PMOS transistor 46b-1 and NMOS transistor 46b-2.

Figure 6:
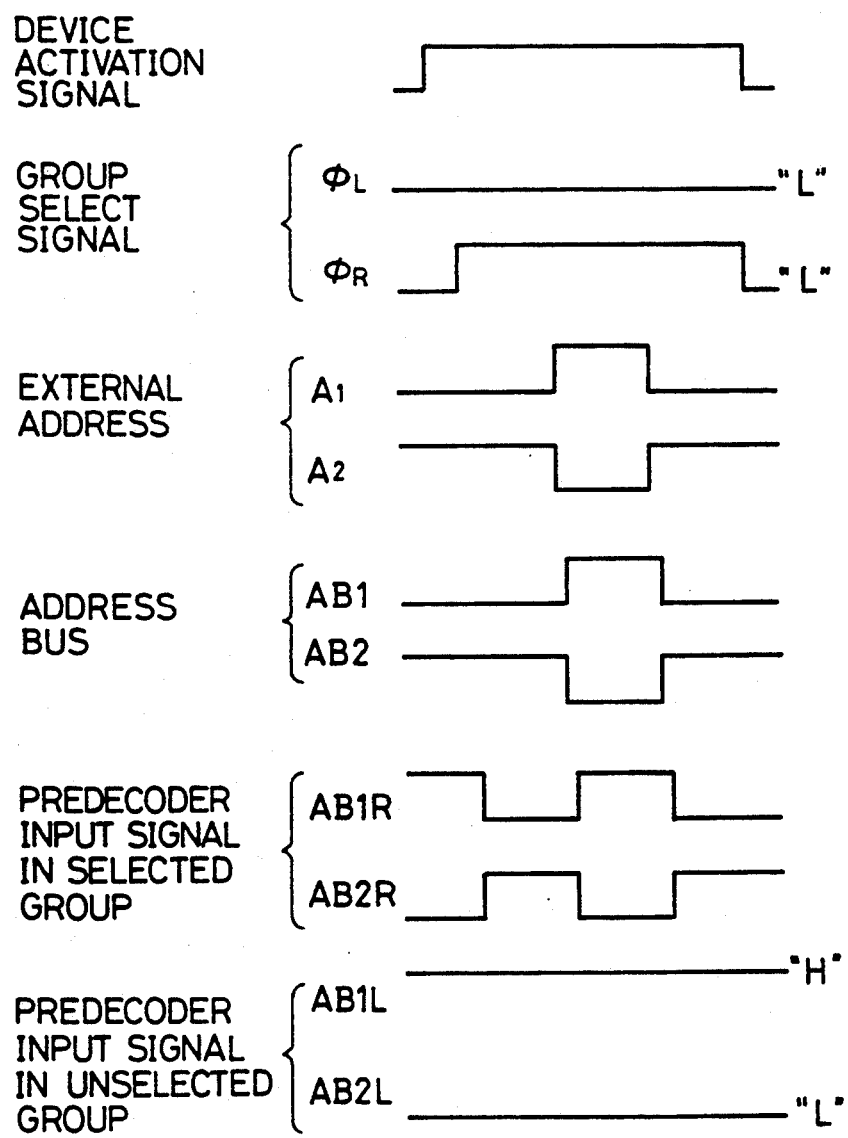
FIG. 6 is a timing chart of the device of FIG. 1.

FIG. 6 shows a timing chart for the device in FIG. 1. The operation of FIG. 1 and FIG. 5 will now be described by referring to this timing chart.

Here it will be assumed group select signal $\phi_L$ is at the low level and $\phi_R$ is at the high level.

First, when group select signal $\phi_L$ is at the low level, the first memory block group 10-1 is set in an unselected state by an unselect/select means not shown, and at the same time, the first predecoder input signal lines AB1L and AB2L of the first predecoder input signal line group 12-1 are clamped to the high level and the low level, respectively, regardless of whether the information in external input address bits A1 and A2 is high or low. In other words, since transmission gates 41-1 and 41-2 are off when group select signal $\phi_L$ is at the low level, predecoder input signal line AB1L is clamped at the high level by level-clamp transistor 43-1 via repeater 45-1, while predecoder input signal line AB2L is clamped at the low level by level-clamp transistor 43-2 via repeater 45-2.

Meanwhile, since group select signal $\phi_R$ is at the high level, the second memory block group 10-2 has been selected by an unselect/select means, not shown, and the second predecoder input signal line group 12-2 assumes high-low binary logic based on the information in external input address bits A1 and A2. In other words, when group select signal $\phi_R$ is at the high level, transmission gates 42-1 and 42-2 are in the ON state and level-clamp transistors 44-1 and 44-2 are in the OFF state, so that the binary logic on external input address bits A1 and A2 is transmitted via address buffers 30-1 and 30-2, address buses AB1 and AB2, transmission gates 42-1 and 42-2, and repeaters 46-1 and 46-2, and appear as predecoder input signals AB1R and AB2R, after a certain time delay.

Next, the operation that takes place when external input address bits A1 and A2 all make a low-to-high transition will be described.

First, when external input address bits A1 and A2 are at the low level, address buses AB1 and AB2 also go low after a certain time delay via address buffers 30-1 and 30-2. Then, after an additional slight time delay, predecoder input signals AB1R and AB2R simultaneously go to the low level. As a result, line loads C1R and C2R on the side of predecoder input signal lines AB1R and AB2R are discharged to the power supply Vss voltage level by the NMOS transistors (46b-2) in the inverters in repeaters 46-1, 46-2.

When external input address bits A1 and A2 make a low-to-high transition, address buses AB1 and AB2 likewise go to the high level after a certain time delay. Then, after an additional time delay, predecoder input signal lines AB1R and AB2R also go from low to high. As a result, line loads C1R and C2R are charged to the high level of the power supply Vcc side by the PMOS transistors (46b-1) in the inverters in repeaters 46-1 and 46-2. Because the charging current at this time is supplied from Vcc, Vcc noise is produced by the supply current. However, since the line load C1L on the side of unselected predecoder input signal line AB1L is charged to the high level on the power supply Vcc side via PMOS transistor 45b-1 in inverter 45b, line load C1L acts as a decoupling capacitor with respect to Vcc, and serves to alleviates the charging current-induced Vcc noise.

Next, when external input address bits A1 and A2 make a high-to-low transition, predecoder input signals AB1R and AB2R likewise go from high to low, and line loads C1R and C2R are discharged to the low level on the power supply Vss side. Since the discharge current now is discharged to power supply Vss, Vss noise is generated. However, since line load C2L on the predecoder input signal AB2L side is discharged to the low level on the power supply Vss side via the inverter in repeater 45-2, line load C2L acts as a decoupling capacitor with respect to Vss, thus alleviating Vss noise induced by above-mentioned discharge current.

In this embodiment, since half (AB1L) of the unselected first predecoder input signal line group 12-1 is clamped at the dc high level while the remaining half (AB2L) is clamped at the dc low level by level-clamp transistors 43-1 and 43-2, line loads C1L and C2L on first predecoder input signal line group 12-1 act as decoupling capacitors with respect to power supplies Vcc and Vss. As a result, the power supply Vcc and Vss noises due to charging and discharging currents of line loads C1R and C2R on the side of selected second predecoder input signal line group 12-2 can be reduced. This makes it possible to enhance the overall performance of semiconductor memory devices in terms of stable operation, response speed, and so on.

Figure 7:
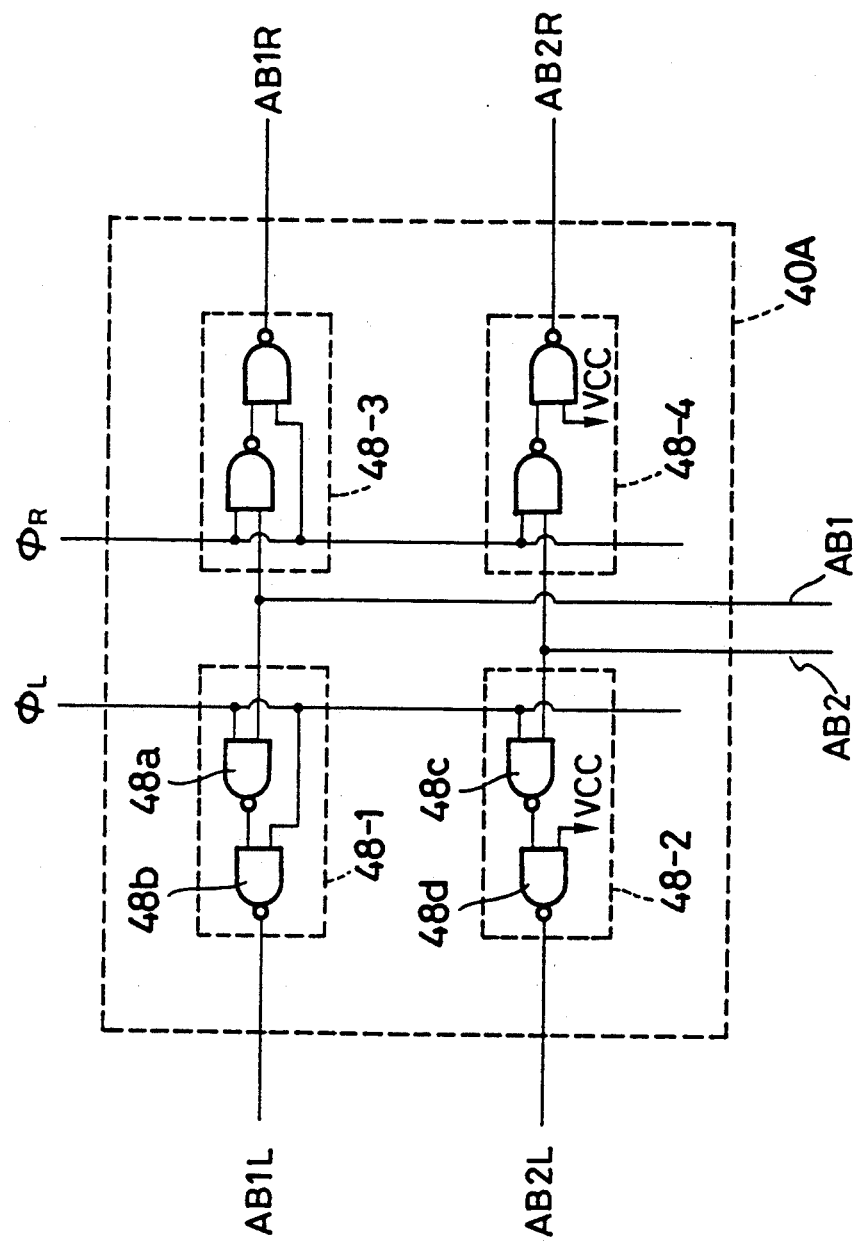
FIG. 7 is a circuit diagram of the predecoder input signal generator of another embodiment of the invention.

FIG. 7 shows another embodiment of the present invention, and specifically shows a circuit diagram of a predecoder input signal generator 40A.

In this embodiment, the predecoder input signal generator 40A is comprised of groups of logic gate circuits, for the respective memory cell block groups. Each group of logic gate circuits consists of gate circuits 48-1 and 48-2; and 48-3 and 48-4, each logic gate circuit being provided for a corresponding bit of the address and consisting of first and second NAND gates (e.g., 48a and 48b) to realize a circuit that offers essentially the same functions as the predecoder input signal generator 40 shown in FIG. 1.

For example, when group select signal $\phi_L$ is at the low level, the outputs of NAND gates 48a and 48b in logic gate circuit 48-1 are both at the high level irrespective of the address signals AB1 and AB2, and the output of NAND gate 48c in the logic gate circuit 48-2 is at the high level and the output of NAND gate 48d having one input connected to Vcc of the high level is at the low level irrespective of address signals AB1 and AB2. As a result, the predecoder input signal AB1L is clamped at the high level and the predecoder input signal AB2L is clamped at the low level irrespective of the address signals AB1 and AB2. When group select signal $\phi_L$ is at the high level, on the other hand, the outputs of NAND gates 48a, 48b, 48c and 48d are dependent on the address signals AB1 and AB2 that are propagated, just as they are, in the form of predecoder input signal AB1L after a certain time delay. Here, NAND gates 48a, 48b, 48c, and 48d have a clamp function as well as a signal-select function, and this multi-functionality should permit simpler circuit designs.

The invention is not limited to the illustrated embodiments, and modifications include the following.

(a) In the embodiment described above, it was shown that when for example the group select signal $\phi_L$ is at the low level, the first memory cell block group 10-1 is set in an unselected state by an unselect/select means, not shown. However, this configuration for setting in an unselected state could achieved in a variety of different ways, as for example, by turning off a switch circuit provided between memory cell block 11 and an I/O data bus, that is not shown in the figure, based on group select signal $\phi_L$. The reason why the first memory cell block group 10-1 is set in an unselected state by means of the unselect/select means is the desirability in view of the reduced power dissipation (and hence, noise), and enhanced operating capability.

In the configuration of FIG. 1, first and second memory cell block groups are made to perform split operation, but it is possible to increase the number of memory cell block groups (for example, to $2^n$), and correspondingly increase in the number of group select signals $\phi_L$ and $\phi_R$. Furthermore, while only two external input address bits A1 and A2 are shown in FIG. 1, usually any arbitrary number of external input address bits can be provided, and corresponding to the number of external input address bits, therefore, the number of predecoder input signal line groups AB1L, AB2L, AB1R, AB2R, and the number of memory cell blocks 11 can be increased beyond the 2 shown in the figure.

(b) When an odd number (2n+1) of predecoder input signal lines (AB1L, AB2L or AB1R, AB2R) form each group (12-1 or 12-2), if approximately half, as for example, n lines or n+1 lines are clamped at the high level, and the remaining n+1 or n lines are clamped at the low level, the same efficacious results are realized as for the previously described preferred embodiment.

(c) Predecoder input signal generator 40 and 40A shown in FIG. 1 and FIG. 7 could be readily configured using other circuits not shown in the figures. The described clamping means in the circuit could likewise be comprised of gate circuits, transistors, etc. in a variety of different ways.

(d) While repeaters 45-1, 45-2, 46-1 and 46-2 depicted in FIG. 1 are provided for driving large loads, this could be achieved more simply with other circuits, such as one-stage inverters, buffers, etc.

From the foregoing detailed description, it is seen that the present invention employs a clamping means to clamp half the unselected predecoder input signal lines in each group at the dc high level and the remaining half of the lines at the dc low level. Adopting this method, line loads on the unselected predecoder input signal line side act as decoupling capacitors with respect to the power supply. This effect serves to reduce power supply noise caused by line-load charging and discharging current on the selected predecoder input signal line group side. As a result, the overall performance of semiconductor memory devices is markedly enhanced in terms of stable operation and response time.

What is claimed is:

1. A semiconductor memory device comprising:
   a plurality of groups of memory cell blocks provided with a plurality of memory cell blocks having predecoders receiving predecoder input signals;

a plurality of groups of predecoder input signal lines respectively connected to the predecoders in said plurality of groups of memory cell blocks;

a predecoder input signal generator responsive to a group select signal for selectively activating at least one of the groups of predecoder input signal lines, and setting the predecoder input signal lines of said selected predecoder input signal line group to either a high level or a low level depending on an external address information; and a clamping means responsive to said group select signal for clamping substantially one half of the unselected predecoder input signal line group to the high level, and the remaining half to the low level when a corresponding predecoder input signal line group is not selected.

2. A semiconductor memory device comprising:

a plurality of groups of memory cell blocks, each memory cell block having a predecoder;

a plurality of groups of predecoder input signal lines respectively connected to the predecoders in said plurality of groups of memory cell blocks;

a predecoder input signal generator responsive to a group select signal for selectively activating one of the groups of predecoder input signal lines, and responsive to an external address information for selecting one of the predecoder input signal lines in the selected predecoder input signal line group;

said predecoder input signal generator setting the predecoder input signal lines of said selected group of predecoder input signal lines to either a high level or a low level in accordance with the external address information;

first clamping means provided for a first half of the predecoder input signal lines of each predecoder input signal line group; and second clamping means provided for a second half of the predecoder input signal lines of each predecoder input signal line group;

said first and second clamping means being responsive to said group select signal for clamping said first half of the predecoder input signal lines to the high voltage level, and said second half to the low voltage level, when a corresponding predecoder input signal line group is not selected.

3. A device according to claim 2, wherein said first clamping means comprises a first transistor provided for each of said first half of the predecoder input signal lines of each group of predecoder input signal lines not selected and connecting each corresponding predecoder input signal line to a power supply node of the high voltage level, and said second clamping means comprises a second transistor for each of said second half and connecting each corresponding predecoder input signal line to a power supply node of the low voltage level, said first and second transistors being turned on when a corresponding predecoder input signal line group is not selected.

4. A device according to claim 2, wherein said predecoder input signal generator comprises groups of transmission gates for the respective groups of predecoder input signal lines, each group of transmission gates consisting of a plurality of transmission gates inserted to transmit the external address bits to a respective group of predecoder input signal lines, said transmission gates of each group being connected to be conductive when a corresponding predecoder input signal line group is selected.

5. A device according to claim 2, wherein said predecoder input signal generator comprises groups of logic circuits for the respective groups of predecoder input signal lines;

each group of logic circuits comprises logic circuits for the respective predecoder input signal lines of a corresponding predecoder input signal line group;

each logic circuit for each of the predecoder input signal lines of said first half comprising a first NAND gate receiving the corresponding bit of the external address, and the group select signal, and a second NAND gate receiving the output of the first NAND gate and the group select signal, and having its output connected to a corresponding predecoder input signal line; and each logic circuit for each of the predecoder input signal lines of said second half comprising a first NAND gate receiving the corresponding bit of the external address, and the group selected signal, and a second NAND gate receiving the output of the first NAND gate and the high voltage level, and having its output connected to a corresponding predecoder input signal line;

whereby said logic circuit function also as said clamping means.

6. A semiconductor memory device having first and second supply voltage nodes comprising:

first memory cell block having a first memory cell array and a first predecoder which, in response to first and second predecoder input signals, provides a first output signal to said first memory cell array so that one of memory cells in the first memory cell array is selected;

first and second conductive lines respectively connected to said first predecoder, said first and second conductive lines each having static capacitance;

a first input circuit for providing said first predecoder input signal corresponding to a first external address signal when a first select signal, applied to said first input circuit, is at a first logic level;

a second input circuit for providing said second predecoder input signal corresponding to a second external address signal when a first select signal applied to said second input circuit is at the first logic level;

a second memory cell block having a second memory cell array and a second predecoder which, in response to third and fourth predecoder input signals, provides a second output signal to said second memory cell array so that one of memory cells in the second memory cell array is selected;

third and fourth conductive lines respectively connected to said second predecoder, said third and fourth conductive lines each having static capacitance;

a third input circuit for providing said third predecoder input signal corresponding to a first external address signal when a second select signal, applied to said third input circuit, is at the first logic level;

a fourth input circuit for providing said fourth predecoder input signal corresponding to a second external address signal when a second select signal, applied to said fourth input circuit, is at the first logic level; and a select signal supplying circuit supplying said first and second select signals, the first select signal being at a second logic level when the second select signal is at the first logic level, the second select signal being at the second logic level when the first select signal is at the first logic level;

said first input circuit being coupled to said first conductive line with the first voltage supply node regardless of the first external address signal when the first select signal is at the second logic level;

said second input circuit being coupled to said second conductive line with the second voltage supply node regardless of the second external address signal when the first select signal is at the second logic level;

said third input circuit being coupled to said third conductive line with the first voltage supply node regardless of the first external address signal when the second select signal is at the second logic level; and said fourth input circuit being coupled to said fourth conductive line with the second voltage supply node regardless of the second external address signal when the second select signal is at the second logic level.

7. A device according to the claim 6, wherein said first supply voltage node is connected to a power supply line and said second supply voltage node is connected to a ground line.

8. A device according to the claim 6, wherein said first logic level is a high level and said second logic level is a low level.

* * * * *